United States Patent [19]

Tew et al.

[11] Patent Number: 4,779,004
[45] Date of Patent: Oct. 18, 1988

[54] INFRARED IMAGER

[75] Inventors: Claude E. Tew, Dallas; Adam J. Lewis, Jr., Richardson, both of Tex.

[73] Assignee: Texas Instruments Incorporated, Dallas, Tex.

[21] Appl. No.: 81,404

[22] Filed: Aug. 4, 1987

Related U.S. Application Data

[63] Continuation-in-part of Ser. No. 853,369, Apr. 15, 1986, Pat. No. 4,686,373, which is a continuation of Ser. No. 528,317, Aug. 31, 1983, abandoned.

[51] Int. Cl.$^4$ ............................................. H01J 40/14
[52] U.S. Cl. .................................... 250/578; 250/332
[58] Field of Search ............... 250/211 R, 211 J, 578, 250/332, 349, 370; 358/213.16, 213.25, 213.26; 357/30 H, 24 LR, 32

[56] References Cited

U.S. PATENT DOCUMENTS 4,571,624  2/1986  Nishizawa et al. .................. 250/578
4,734,582  3/1988  Gibbons et al. ...................... 250/332

Primary Examiner—David C. Nelms
Attorney, Agent, or Firm—Carlton H. Hoel; Leo N. Heiting; Melvin Sharp

[57] ABSTRACT

An infrared imager, wherein a transparent gate 14 is separated from a very narrow bandgap semiconductor 106 (such as HgCdTe) by a thin dielectric 15, 62. The gate 14 is biased to create a depletion well in the semiconductor 106, and photo-generated carriers are collected in the well. The gate voltage is sensed to measure the accumulated charge. Preferably the accumulated charge is not sensed directly from the gate, but the gate output is repeatedly averaged with another capacitor, so that the outout of the imager is sensed as in average over a number of read cycles, which provides a greatly improved signal-to-noise ratio. Preferably an array of the MIS detection devices is formed in a thin layer of HgCdTe 106, which is bonded to a silicon substrate 107 containing a corresponding array of the averaging capacitors with addressing and output connections, and via holes 16 through the HgCdTe are used to connect each detection device to its corresponding averaging capacitor.

6 Claims, 15 Drawing Sheets

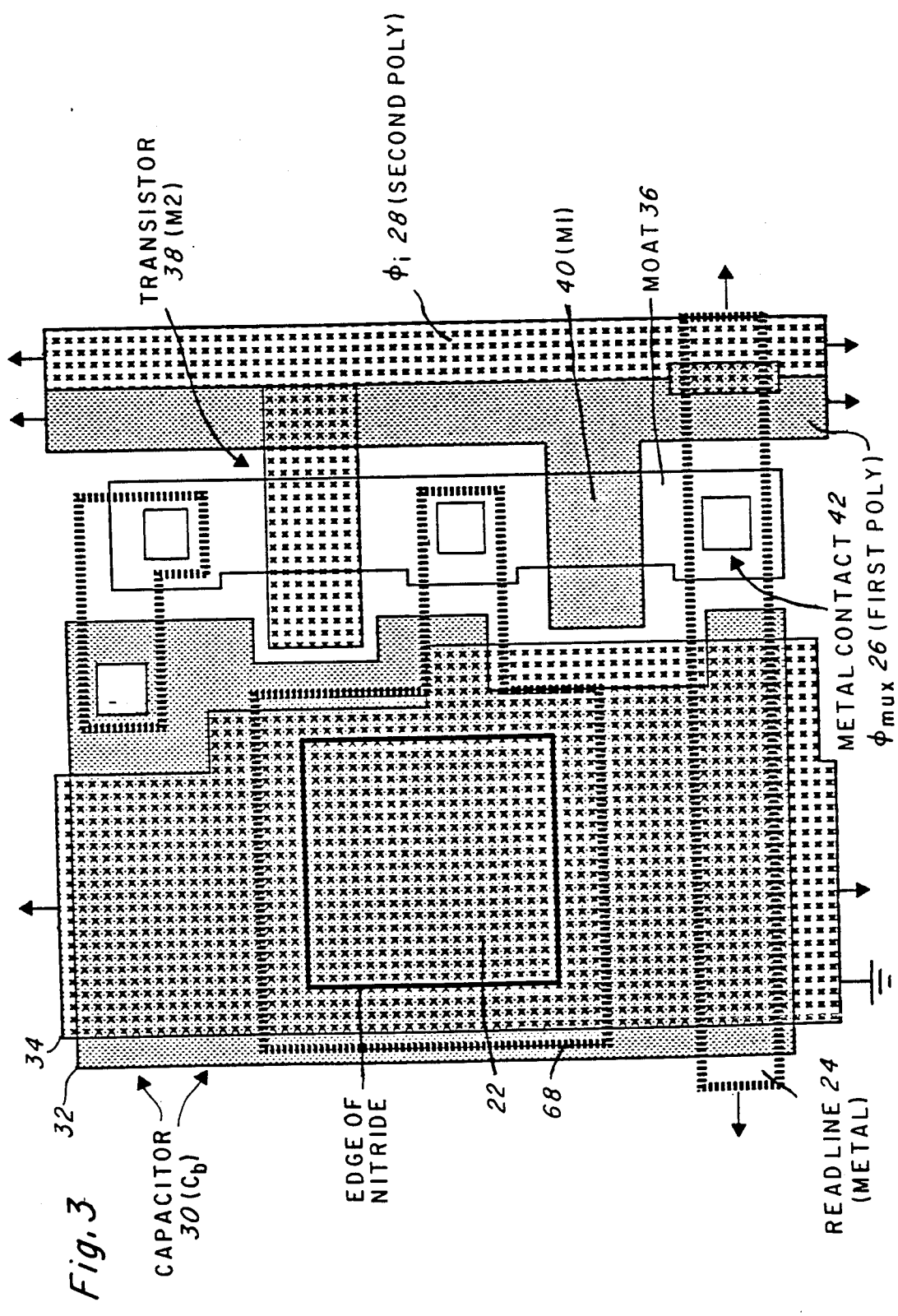

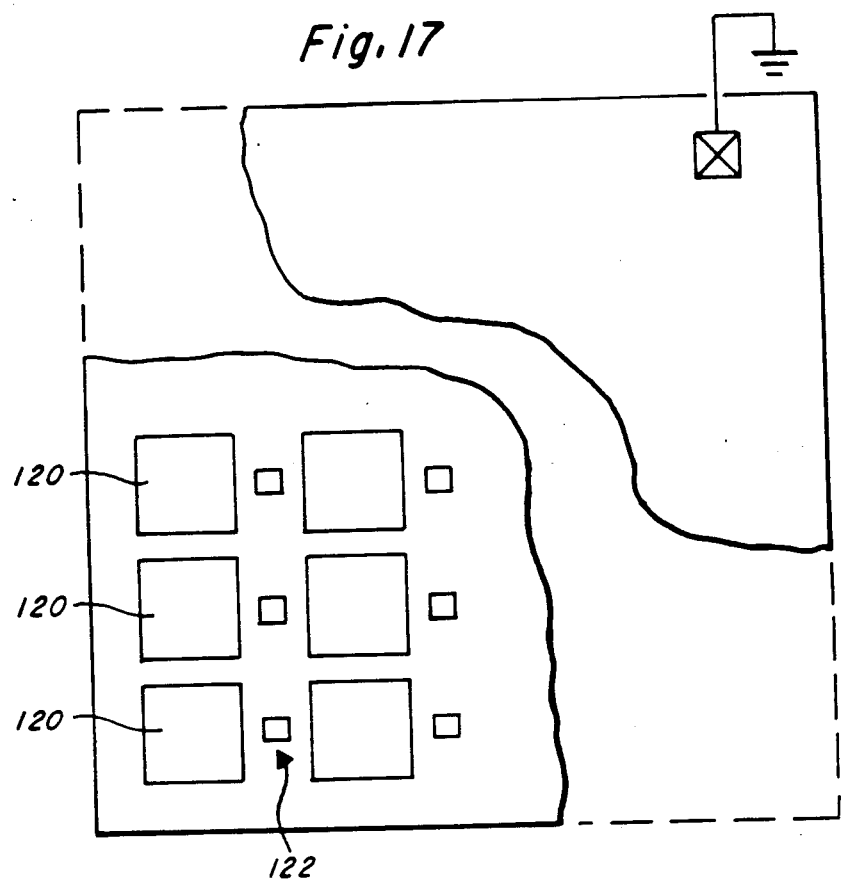
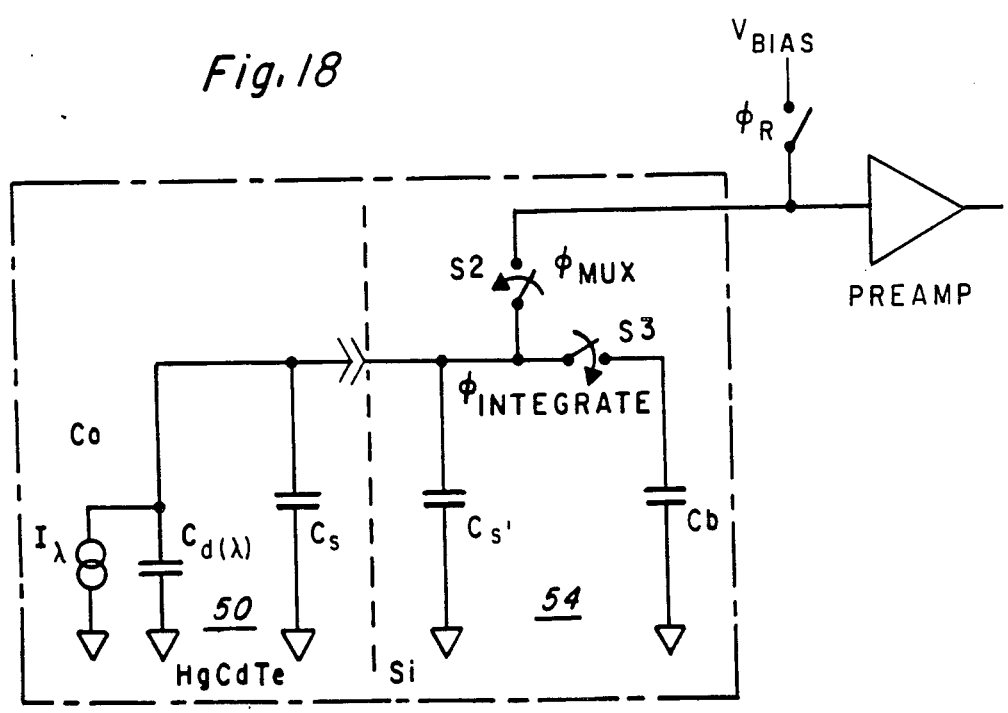

INFRARED IMAGER

CROSS-REFERENCE TO RELATED APPLICATIONS

This application is a continuation-in-part of copending U.S. application Ser. No. 853,369, filed Apr. 15, 1986, now U.S. Pat. No. 4,686,373 which was a continuation of U.S. application Ser. No. 528,317, filed Aug. 31, 1983 and now abandoned. Copending U.S. application No. 851,918, filed Apr. 15, 1986, now U.S. Pat. No. 4,684,812 disclosed related subject matter. All of these cross-referenced applications are assigned to the assignee of this application.

BACKGROUND AND SUMMARY OF THE INVENTION

The present invention relates to infrared imagers.

It is highly desirable to have an infrared area array imager which will provide a detailed image at wavelengths down to the limits of the available long-wavelength atmospheric window, i.e. at wavelengths of 8–12 microns.

The detection of such long wavelengths, if it is to be done at moderate cryogenic temperatures (e.g. at liquid nitrogen rather than liquid helium temperatures), is preferably done using a very narrow bandgap semiconductor, such as $Hg_{1-x}Cd_xTe$. (Such alloys, where x ranges from 0 to 1, are generally referred to as "HgCdTe".) This pseudo-binary alloy, if it has a composition such as x=0.2, will have a bandgap small enough (about 0.1 eV) to be bridged by 12 microns photons.

Conventional approaches using HgCdTe area arrays have typically used HgCdTe photodiodes as optical detectors, and have interconnected these photodiodes with silicon processing stages.

However, if any sizable array of infrared detectors is used, it can be a very difficult problem to get the raw output of the infrared detectors over to the silicon processor stages. That is, there are many applications for which a two-dimensional focal plane array larger than 100×100 would be desirable. In such applications, it is very difficult to connect so many infrared detector locations to silicon processing stages without greatly degrading the duty cycle of the detector stages. In particular, where photo-diode detector cells are used, the silicon processing circuitry required is rather complex, and a merely reasonable pitch in the infrared imaging plane (e.g. 0.002" pixel spacing center-to-center) would impose stringent requirements on silicon geometry, if the same pitch must be followed in the silicon processing stages.

One method which has been used in the prior art to connect infrared detector sites to silicon processors is a hybrid approach, in which the infrared detector cells are bumpbonded, in many separate operations, onto a silicon carrier; this is an expensive low-yield operation.

Thus it is an object of the present invention to provide an infrared focal plane array imager architecture which permits direct connection from an infrared detection site to silicon processing stages. It is a further object of the present invention to provide an infrared focal plane array imager architecture which permits very high duty cycles at the infrared sensor sites.

An important difficulty in the development of usable long-wavelength infrared imaging arrays has been the stringent requirements placed on materials quality. That is, to achieve acceptable device characteristics (e.g., large well capacity, high sensitivity, low dark current, large dynamic range, etc.) using the prior art techniques, material having inherent carrier concentrations from the low $10^{14}$s per cc on down is conventionally required. Such material is very difficult to fabricate reproducably.

Thus it is an object of the present invention to provide a long-wavelength infrared imager which does not impose stringent material requirements. It is a further object of the invention to provide a long-wavelength infrared imager which does not require inherent carrier concentrations below $5 \times 10^{14}$ per cubic centimeter.

A further difficulty in long-wavelength imaging is that the background flux is very high. That is, the peak black body wavelength at room temperature is very close to 12 microns, so that stray (nearfield) long-wavelength radiation is likely to be generated by the infrared imaging optics of the imaging system. Moreover, very little of a field of view will usually be truly dark. That is, in thermal imaging the brightness variation within an image will be due to typically small variations in temperature and to variation in the black-body coefficients. These effects produce a dynamic range within a scene which is relatively small. Little of the photon flux carries information since most of the flux merely corresponds to the high average temperature of the scene. This is frequently handled, in conventional long-wavelength imaging systems by a "skimming" operation in which the signal from each pixel is threshold to eliminate the effect of the background flux. However, this thresholding operation does not improve the signal-to-noise ratio, and may worsen it, since the noise component due to fluctuation in the background flux remains.

Thus it is an object of the present invention to provide a long-wavelength detector which provides a very good signal-to-noise ratio, even in the face of substantial long-wavelength background flux.

The present invention teaches an infrared imager, wherein an array of detection devices is formed in a thin layer of HgCdTe, which is bonded to a silicon substrate containing a corresponding array of averaging capacitors with addressing and output connections, and via holes through (or bump bonding posts on) the HgCdTe are used to connect each detection device to its corresponding averaging capacitor. The signal from each detection device is repeatedly averaged into its averaging capacitor, so that the output of each pixel site is sensed as an average over a number of read cycles which provides a greatly improved signal-to-noise ratio.

BRIEF DESCRIPTION OF THE DRAWINGS

The drawings are schematic for clarity.

The present invention will be described with reference to the accompanying drawings, wherein:

FIG. 3 shows the layout of the silicon processing gates underneath and corresponding to one detector pixel;

FIGS. 16, 17 and 18 show a further alternative embodiment using photodiode detectors.

DESCRIPTION OF THE PREFERRED EMBODIMENTS

Figure 6:
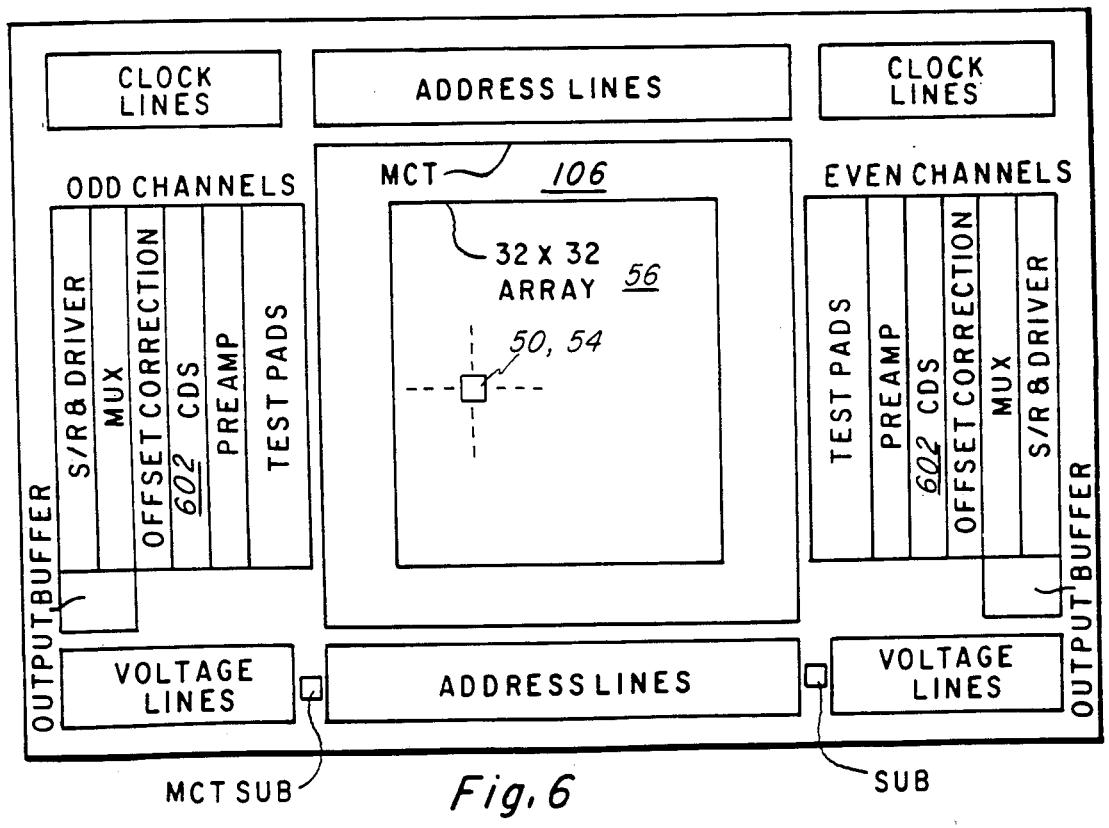
FIG. 6 shows the overall layout of the complete imager electronics according to the present invention.

The entire imager chip of the present invention is generally shown in FIG. 6. In the center is shown a HgCdTe area 106. Which contains, in this embodiment, a 32×32 array 56 of detector sites 50 such as those shown in FIG. 2. Directly beneath each HgCdTe detector site 50 is a silicon averaging capacitor site 54. The sequence of signals read from each HgCdTe detector site 50 is recursively averaged in its corresponding silicon averaging capacitor site 54, and the output from the silicon averaging capacitor is then provided to one of the output circuits shown on the left and right sides of the drawing.

The fabrication and structure of the HgCdTe detector sites 50 will first be described. The referred architecture of the silicon underneath the HgCdTe, and the preferred operation of the array, will be described subsequently.

Figure 2:
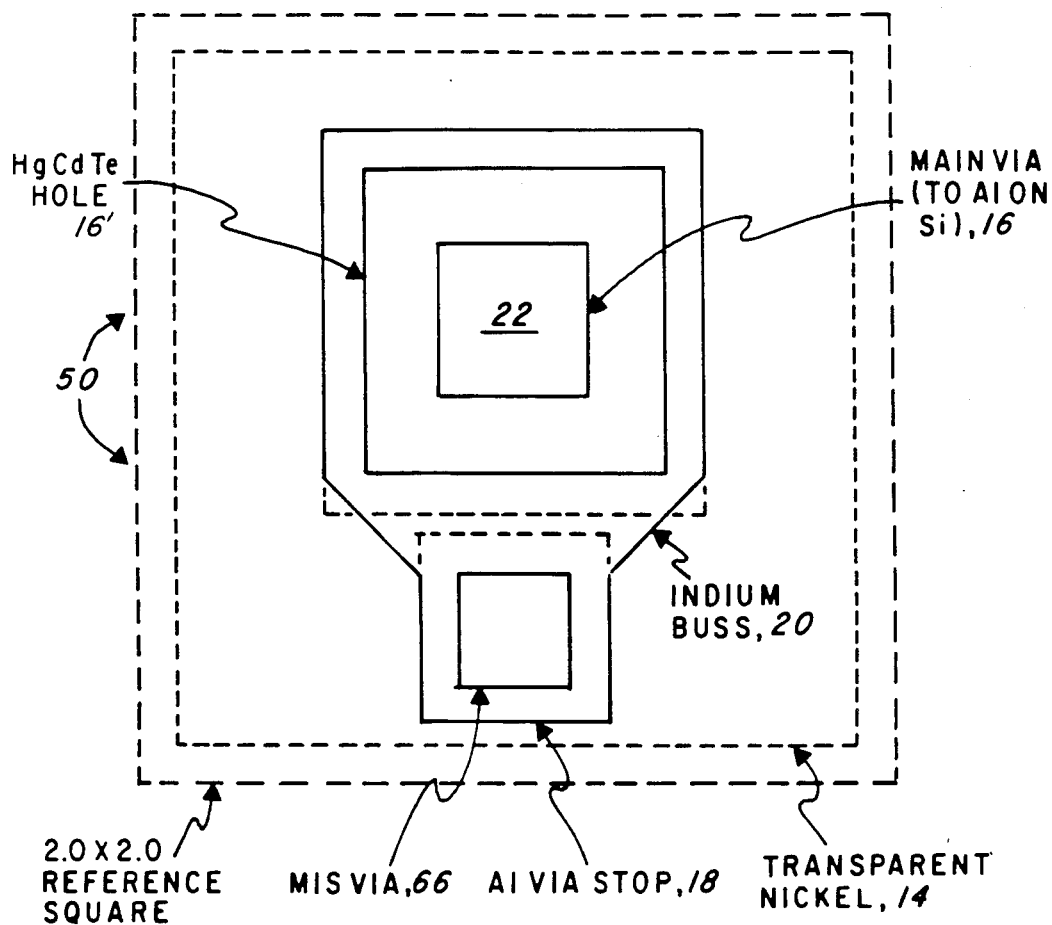
FIG. 2 shows a plan view of a single pixel of the HgCdTe device structure according to the present invention.

A plan view of the presently preferred embodiment of each of the HgCdTe detector sites is shown in FIG. 2. With the geometries shown, about 35% of the total area is optically active, and about 55% of the total stores charge. The HgCdTe substrate 106 comprises long-wavelength material, e.g., $Hg_8Cd_2Te$. A storage gate 14 of semi-transparent metal (e.g. nickel or chromium) is provided for each pixel. Note that the storage gates for adjacent pixels are separate, and there is no electrical contact whatsoever between adjacent pixels in the HgCdTe. The storage gate 14 is preferably thin, e.g. 100 angstroms, to promote transparency. This storage gate overlies an insulator 15, such as zinc sulphide. A main via 16 connects the HgCdTe sensor portion to the corresponding silicon averaging capacitor site. (Outline 16' shows the top edge of this via.) In order to make contact to the extremely thin storage gate, via stop 18 is placed on the storage gate 14, and a metal film interconnect 20 (e.g. 1 micron of indium) is used to connect the via stop 18 to the contact 22 on the silicon at the bottom of the via.

The formation of this device structure will now be described. Massive amounts of processing detail are included, to provide a fully enabling description of the invention, of these processing details do not define limitations of the invention.

First, a monocrystalline HgCdTe slice is lapped to be parallel. At least one side is polished smooth, using one half percent bromine in methanol. The polished side is anodically oxidized to about 700 angstroms of oxide 58 in potassium hydroxide. See U.S. Pat. No. 3,977,018, which is hereby incorporated by reference.

Preferably the HgCdTe used is n-type, with a carrier concentration of $5 \times 10^{14}$ per cubic cm. Of course, lower carrier concentrations could be used.

Next, the HgCdTe is mounted on the silicon processors. For convenience, the HgCdTe mounting is preferably done before the silicon wafer has been completely diced up into chips, so that a HgCdTe bar can be mounted to, e.g., four scribed silicon chips simultaneously, before the chips are actually separated. The silicon substrates (chips or groups of chips) are preferably flat, and must be cleaned thoroughly on both sides. The silicon substrates (chips or groups of chips) are preferably flat, and must be cleaned thoroughly on both sides. Each silicon substrate is heated to a controlled temperature of 75 C., and a very low-viscosity and low-surface tension glue 60 is then applied to the center detector attern (i.e. to the averaging capacitor area on each of the silicon chips) on each silicon bar. The HgCdTe bar is then placed on the silicon substrate, oxide down. The alignment marks in the silicon are used to obtain rough alignment of the HgCdTe bar at this time. A press is used to hold the HgCdTe in place while the glue sets, using, e.g., three to four ounces to pressure over the 32×32 array. The gluing step is required to produce a thin and uniform glue bond, and a low viscosity epoxy glue such as Epotek 301 is preferably used. After the lying operation, the excess HgCdTe which hangs over the edges of the silicon bar is then scribed and broken off.

The silicon substrate, having the HgCdTe bar glued to it, is now waxed to a glass lapping plug. (These plugs are commercially available parts, formed, e.g., as cylinders one inch in diameter and 1¾ inches tall, having flat and parallel ends.) The flatness of the substrate on the lapping plug is preferably within two microns. If it is not flat within two microns, the waxing step is preferably performed over. The thinning steps can then begin. Preferably the alignment marks on the silicon are protected, e.g. by painting them with resist and curing, prior to the lapping operation. The remainder of the silicon processor bar should be adequately protected by its thick (preferably one micron) nitride protective overcoat. It may also be desirable to protect the contact pads on the silicon bar during the polishing step. Alternatively, exposed resist is applied over the whole structure prior to polishing. The resist on the HgCdTe will be polished off. The HgCdTe is then lapped, e.g. with three micron grit on glass down to about 75 microns thick, followed by lapping with 0.3 micron grit on a polishing cloth (e.g., Buehler "Texmet" TM) until the scratches left from the three micron lap are gone. The HgCdTe is then polished, with half percent bromine-methanol on a pellon pad, down to 20 to 25 microns. A final polishing step, using one eighth percent bromine-methanol solution, takes the HgCdTe down to 12 microns above the silicon surface.

The silicon substrate is then wax-mounted to a silicon secondary substrate, which is used simply as a carrier for processing. Alternatively, sapphire or other rigid material can be sued for this carrier.

At this point, the structure in hand is a long thinned strip of HgCdTe, glued across several connected Si chips. The first patterning step is now performed, to reduce the area 106 required for the imaging array 56 on each chip. (In addition, a small strip of HgCdTe is also preferably left in place connecting each of the arrays together. This provides electrical connection between the HgCdTe areas, and is useful to pass current during anodic oxidation. It will be removed later during processing.)

Preferably this step is done, e.g. by spinning on a resist such as 180CP (available from Hunt) at 4,000 RPM for 20 seconds. The resist is dried for three minutes at 60 C., and ashed at 200 watts for 30 seconds. At this point, it is again desirable to apply special protection to any exposed aluminum, such as the alignment marks, since aluminum is attacked by bromine-methanol. A spray etch with fresh $\frac{1}{8}\%$ bromine-methanol is then applied until the pattern clears, i.e. until the separation trenches have etched down to the epoxy. The remaining thin epoxy is then ashed off on a plasma asher and the photoresist is then removed.

The second patterning step patterns the via 16 through the HgCdTe. This is a crucial step, since the via 16 geometry must satisfy several constraints. If the via 16 is etched to be too narrow, the device can short out at the bottom of the via. If the via is etched too wide, so that it intrudes into the active area of the device, the dark current will be great increased. Third, the walls of the via 16 must be very smooth to provide good step coverage. For example, simple ion milling may leave rough walls. Thus, the presently preferred embodiment uses ion milling to make a small via hole (e.g. 0.4 mils), then uses spray etching to enlarge the via to get to the final diameter. After the resist is patterned, the ion milling is preferably done with argon ions, using e.g., 600 milliamps beam current at 600 volts at about $\frac{1}{4}$ Torr of pressure. The stage is preferably angled ten degrees to the beam and is rotated. This stage must be cooled. In the presently preferred embodiment the stage is cooled to about 5 C. during milling. Preferably the ion milling is performed intermittently to assure that the device does not heat up locally. Heating is most undesirable because the dissociation of HgCdTe occurs at relatively low temperatures. Such dissociation can alter the bandgap, degrade interface stability, increase the carrier concentration, or have other undesirable effects. After ion milling has cut all the way through the HgCdTe, the device, with its photoresist still intact, is spray etched in fresh $\frac{1}{8}\%$ bromone- methanol in ten second stages until the via has been undercut to a total diameter of (in the presently preferred embodiment) 0.8 mils. After the photoresist is removed, the whole device is then static etched in one-eighth percent bromine methanol for thirty seconds, to remove any damaged layer which may have been generated during the ion milling step, and to smooth the top lip of the via for better subsequent step coverage.

The next step is growth of an anodic oxide layer 62 on the HgCdTe. After a preliminary ashing step for cleanup, oxide is grown to first blue (around 700 angstroms thickness) in potassium hydroxide, using a current of e.g., 23 microamps for a 1-device substrate. This provides a mixture of cadmium oxides, Te oxides, and tellurites. This layer plus the zinc sulfide layer 15 form the insulator of the MIS capacitor. Resist is now patterned to define the areas where the first zinc sulfide layer 15 is to be deposited. Preferably 2500 angstroms of zinc sulfide is deposited by evaporation off axis (e.g. 30 degrees off axis) onto a rotating table. The zinc sulfide is lift patterned, e.g. by immersion and spray in tetrachloroethylene.

ZnS over anodic oxide is the preferred insulator, but many others (preferably of high permittivity, to provide high capacitance values) can be used, e.g. $Nb_2O_5$, $Ta_2O_5$, $TiO_2$, $TiO_2/Al_2O_3$ composites, etc.

The transparent MIS gate 14 can now be deposited. A thin resist layer (e.g. 4000 or 5000 angstroms) is formed over areas outside of the storage gate 14. A short ion milling step is applied for adhesion before the gate is actually deposited. One hundred twenty five angstroms of nickel is then deposited, and lifted off from undesired areas.

The via stop 18 is then formed, again by lift off. Preferably 800 angstroms of aluminum are used. Again, an adhesion milling step is preferably used before the metal is deposited.

A second zinc sulfide layer 64 is then deposited in the same locations as the first zinc sulfide layer. Preferably 9000 angstroms are deposited in the second layer. Preferably in adhesion milling step is used before the zinc sulfide is deposited. Again, the zinc sulfide is patterned by liftoff.

Next, the MIS via 66 is cut. This will cut the opening for connection of the metal interconnect 20 to the via stop 18 on the storage gate 14. This is preferably done using a $\frac{1}{8}\%$ bromine-methanol wet etch.

Next, the substrate via is preferably cut. The substrate via is not shown in FIG. 2, but provides the bias connection for the HgCdTe substrate, and thus for the MIS capacitor. This etch is preferably done using $\frac{1}{8}\%$ bromine methanol.

Figure 1:
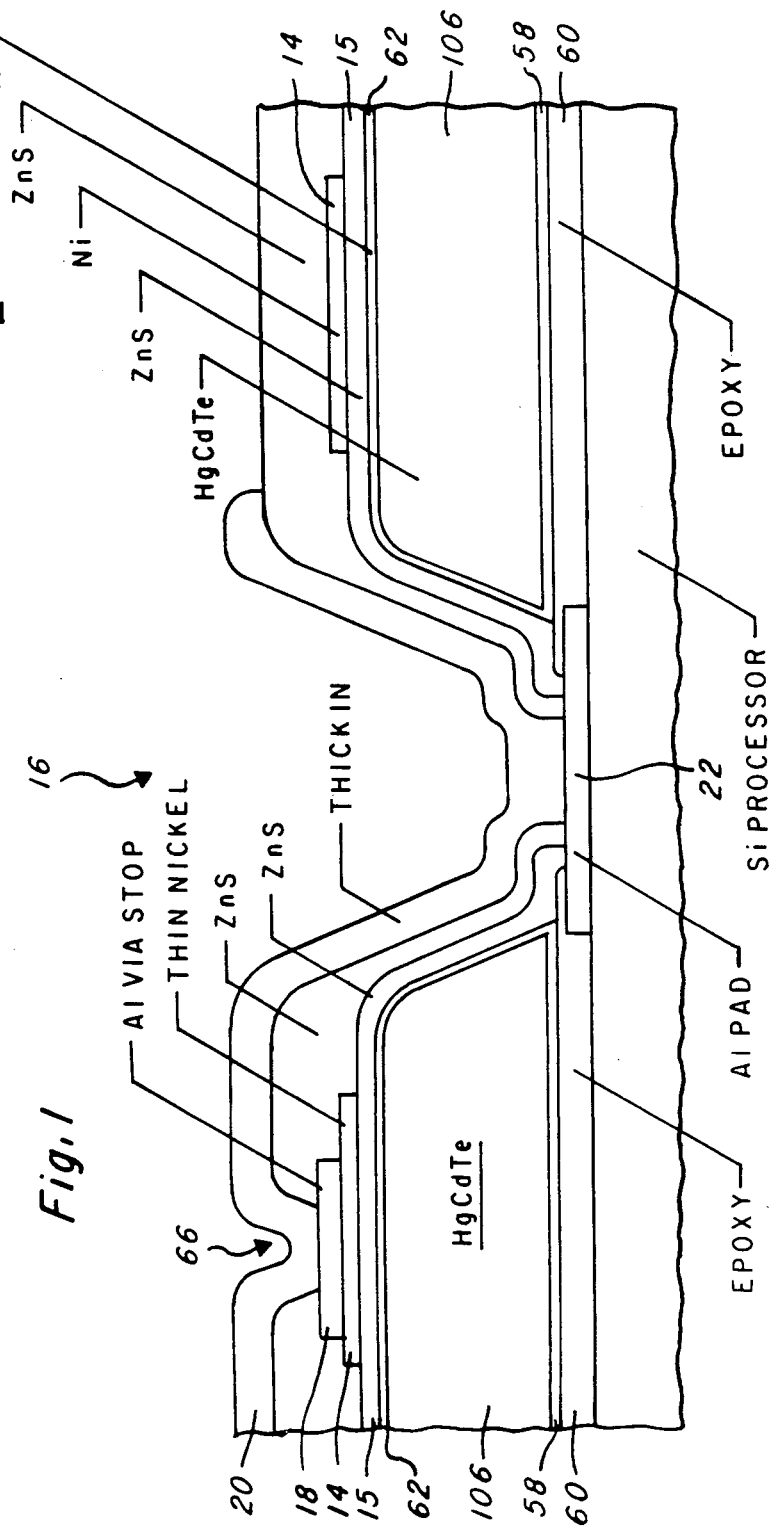
FIG. 1 shows a cross-section of a portion of a single pixel of the HgCdTe device structure according to the present invention.

The main via 16 is then opened again. In this case, a $\frac{1}{8}\%$ bromine-methanol etch is preferably used. This etch is used to open up contact through the zinc sulfide to the aluminum bond pads 22 in the underlying silicon, as shown in FIG. 1. Note that, at the bottom of via 16, a substantial width of the first insulator layer 15, and the second insulator layer 64 separates the HgCdTe substrate 106 from the interconnect 20 and bond pad 22.

Finally, the metal interconnects 20 are patterned. Preferably these too are patterned by liftoff. Preferably a double adhesion mill is performed and 100 angstroms of nickel is deposited first, and then about $1\frac{1}{2}$ microns of indium are deposited (using angle sputtering). At this stage also are formed the ground connection for the HgCdTe bar (substrate) 106, through the substrate via.

One effect of the anodic oxidation process which is used in the presently preferred embodiment as described above is that a substantial amount of positive trapped charge remains in the oxide. This is actually advantageous, since this trapped charge in effect acts as a channel stop. That is outside of the region covered by the MIS storage gate 14, a space charge of electrons will be found at the surface of the HgCdTe material 106. Thus, the well created underneath the storage gate, using n-type HgCdTe as in the presently preferred embodiment, will collect substantially only photo generated holes, which provide the desired signal.

Figure 15:
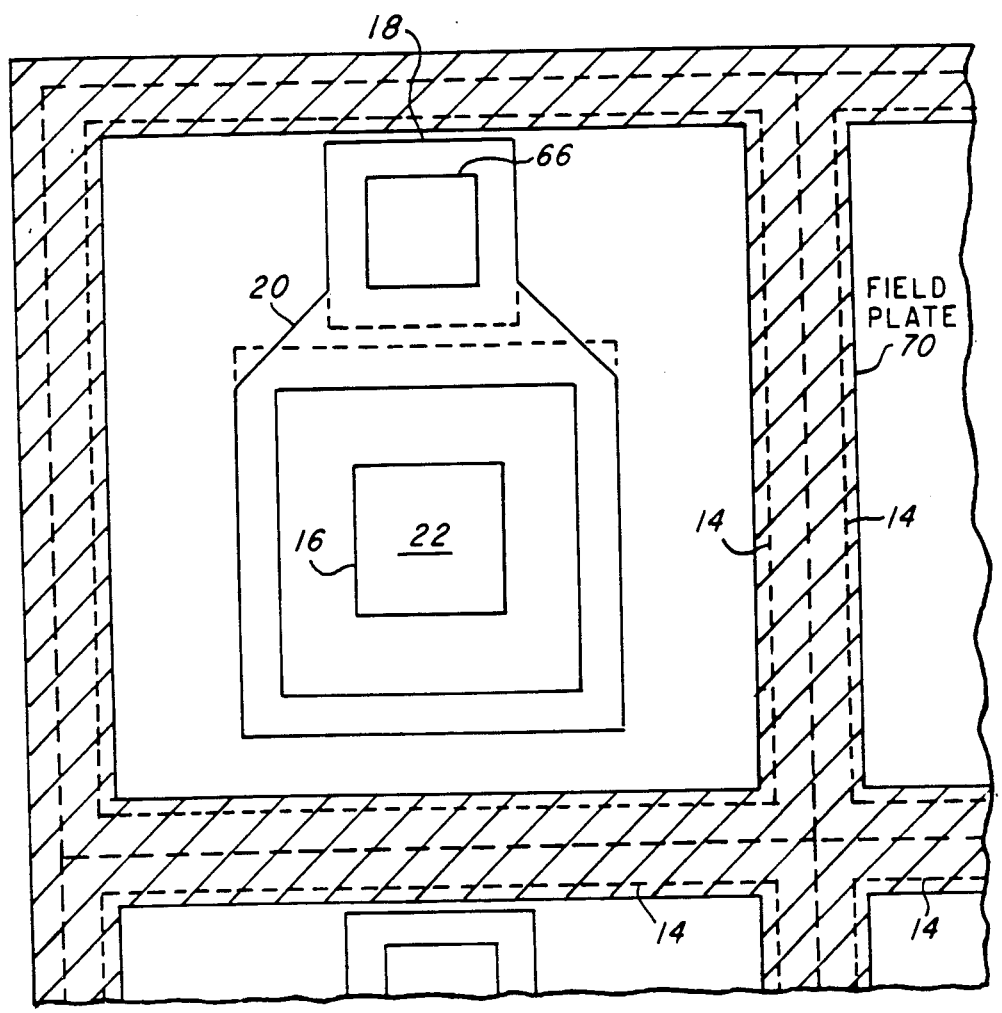
FIG. 15 shows an alternative embodiment of the HgCdTe cell, using a field plate.

However, an alternative embodiment of the present invention uses p-type rather than n-type HgCdTe material, again at a carrier concentration of, e.g., $5 \times 10^{14}$ per cubic centimeter (although the actual carrier concentration may, in p-type as in n-type embodiments, be anywhere from $5 \times 10^{16}$ down to $1 \times 10^{13}$ or less). In this case, positive trapped charge in the oxide does not have a channel stop effect, but has precisely the opposite effect. That is, the space charge of electrons which is found all over the surface of the HgCdTe 106 will immediately flow into the depletion wells underneath the storage gates 14, swamping the desired signal provided by photoelectrons. Thus, in the embodiment of the present invention which uses p-type material and anodic oxide, one additional masking step is used to deposit a field plate 70 (as shown in FIG. 15) over the whole surface of the HgCdTe except for the storage gates 14 are found. The mask used for the field plate is preferably the complement of the mask used for the MIS gates 14, or is slightly larger. That is, a small degree of overlap should be provided between the field plate and the storage gates 14.

Note that use of the field plate is not restricted to embodiments using p-type material, but can also be used in many other embodiments, and in particular, is desirable in an embodiment where the insulating layer does not contain a sufficient amount of trapped charge of the proper sign. FIG. 15 shows an embodiment using a field plate 70.

Figure 4:
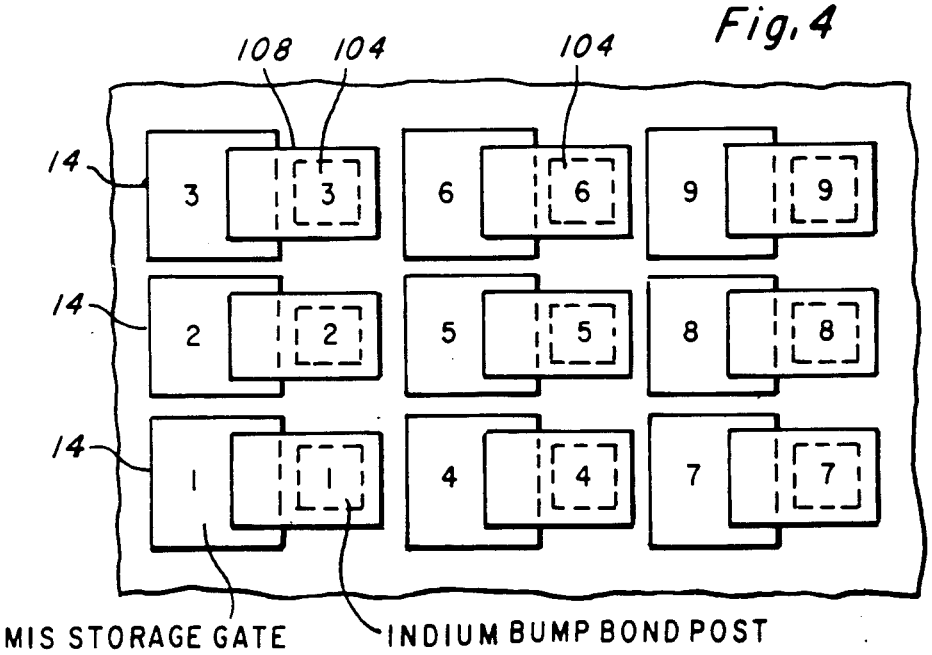
FIGS. 4 and 5 show a plan and a section view of an alternative embodiment of the invention, wherein the MIS gate is connected to silicon by means of an indium post rather than by a via.
Figure 5:
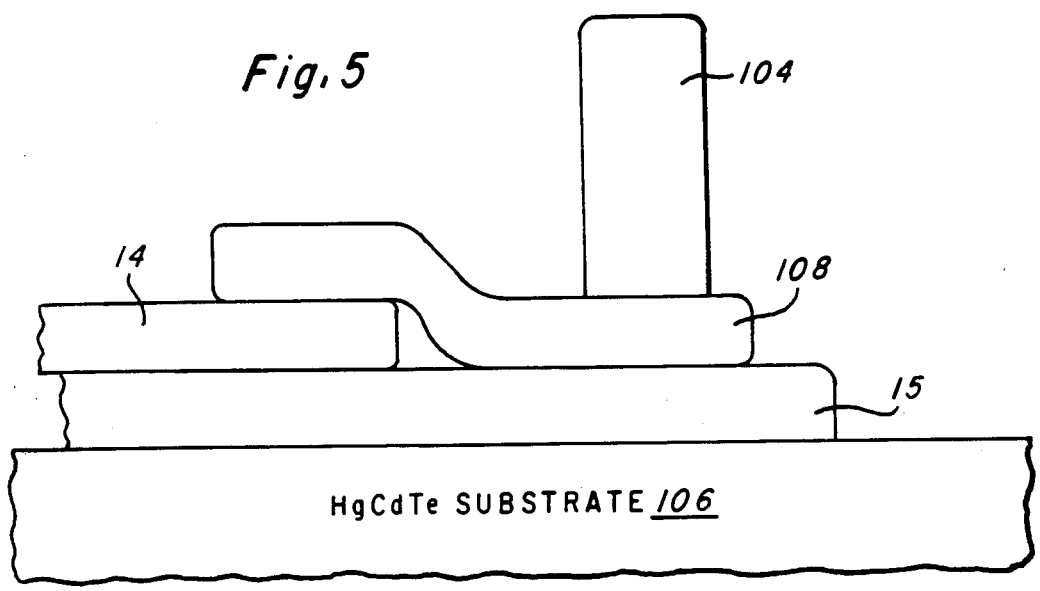

A further embodiment of the present invention, in which bump bonding rather than via connections is used to connect the narrow-bandgap semiconductor to the silicon substrate, is shown in FIGS. 4 and 5. In this embodiment, there is still exactly one averaging capacitor site located in the silicon underneath each detector site in the HgCdTe, but bump bonding is used rather than via methods to form a connection. That is, as shown in FIG. 5, each storage gate 14 would be connected through a bonding strap 108 to a tall indium post 104. The respective indium posts 104 are then pressed onto a pattern of the contact pads 22 on the silicon, and, preferably with slight heat applied to assist fusion, the indium posts 104 are cold-welded onto the contact pads in the substrate. A low viscocity epoxy glue is preferably used to fill the void in the remaining spaces above the substrate. In this case, since no via needs to be formed, thinning of the HgCdTe is removed from the constraint imposed by via geometry. However, since in this configuration the collection is at the backside and not at the exposed surface of the device, it is desirable to thin the HgCdTe so that the locations where the photo carriers are generated will not be too far away from the collection sites. Although the diffusion length of carriers in HgCdTe is normally extremely long, collection is still most efficient when the location where photogeneration of the carriers occurs is not too far removed from the location where collection occurs.

Alternatively, this structure can be fabricate epitaxially. That is, using a cadmium telluride (CdTe) substrate, a thin epitaxial layer of HgCdTe is used for the active device structure. Where bump bonding is used to connect such a structure, the CdTe substrate can be as thick as is desirable for mechanical handling properties, since CdTe is transparent to wavelengths from about 1 micron to about 30 microns. Similarly, other materials may be used. For example, epitaxial HgCdTe may be grown on CdZnTe substrates; and superlattices of HgTe-CdTe or materials such as HgZnTe, HgMnTe, HgCdZnTe, PbSnTe, InSb or InBiSb may be the infrared-sensitive material. Of course, for epitaxial material the underlying substrate is removed in the thinning process following the gluing to the silicon substrate.

Figure 16:
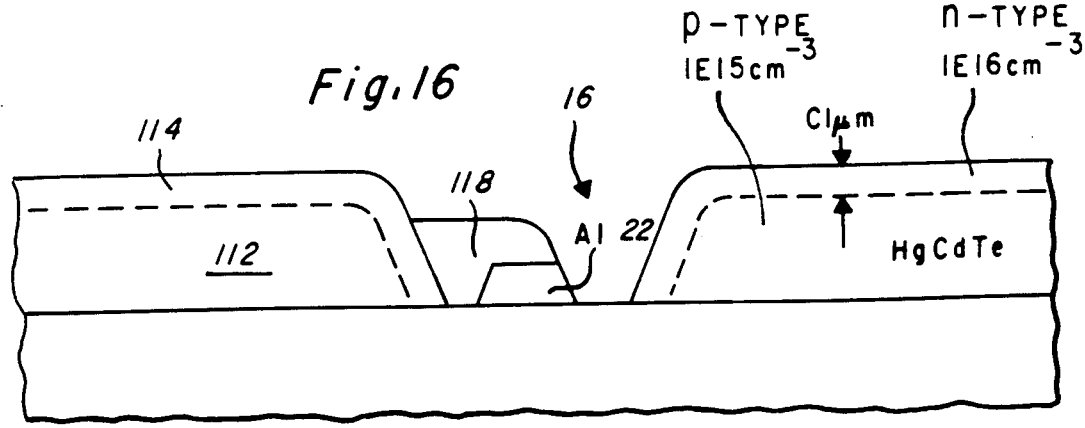

In a further embodiment of the invention, a photodiode structure rather than an MIS capacitor can be used as the detector site. That is, a device structure such as shown in FIG. 16 would be used at the HgCdTe level.

In this case, the HgCdTe material used is preferably p-type material having a carrier concentration of, e.g., $1 \times 10^{15}$ per cubic centimeter. Atop this p-type material 112 would be formed an n-type layer 114, which is preferably less than 1 micron thick (again, it is desirable to have the site of photogeneration of carriers be close to or coincident with the sight of their collection. Even long-wavelength photons are normally absorbed in a semiconductor very close to the surface, e.g. within one-half micron.) This structure can be formed, for example, after the HgCdTe material has been bonded to the silicon and thinned as described above, by cutting the via hole 16 down to the aluminum contact patterns 22 and silicon as described before. At this point processing diverges.

To form the n-type layer 114, almost any species of ion can be implanted, since the implant damage, rather than the particular species implanted, tends strongly to produce n-type material in HgCdTe. Thus, a species which is not a dangerous impurity in silicon is preferably implanted, and the species implanted need not even be a dopant impurity in HgCdTe. For example, argon ions can be implanted to produce n-type layer 114. Since this is done after the via hole has been patterned, the walls of the via hole 16 are also implanted, so that formation of an ohmic contact from the n-type layer 114 to the contact pad 22 on the silicon can be very easily performed, simply by depositing a small amount of metal 118 (such as indium over nickel) at the bottom of the via hole 16. (Of course, it is preferable to use metals which are not as dangerous to silicon as nickel.) The same mask which is used to cut the via hole 16 can be use to pattern the metal 118. Since it is very easy to form ohmic contacts to HgCdTe, and particularly n-type HgCdTe, the choice of the metal 118 is very easy. To achieve channel stops, preferably the HgCdTe is etched away to form mesas 120, as shown in FIG. 17. Again, it is necessary to have some ground connection for the p-type HgCdTe substrate. An alternative way of connecting the n-type regions 114 to the aluminum pad 22 on the silicon is through a via which is not located within the active device mesa 120, but is adjacent to it, as shown by the vias 122 in FIG. 17.

In operation of a photodiode embodiment of the present invention, the chief difference is that, in effect, the photodetector site represents a depletion capacitance, instead of the series combination of a depletion capacitance with an MIS gate insulator.

Thus, the general mode of operation of the photodiode embodiment is fairly similar to that of the MIS embodiment. That is, a bias voltage is applied to the photodiode which opens up a wide depletion region at the junction boundary. As photocarriers are generated, this depletion region will be narrowed. It should be noted that the operation of a photodiode is inherently self limiting, that is if exposed to a constant flux for an infinite amount of time, the voltage across the photodiode will asymptotically approach the limit value. That is, when the diode is operated in an open circuit, it debiases itself until it reaches a point where the current of photo carriers is balanced by the effects of recombination and tunneling across the completion region. The barrier height of such diodes is preferably less than one-half electron volt.

Thus, in operation, a bias voltage Vb is first applied to both the photodiode and the averaging capacitor Cb. After the photodiode has had time to collect flux, it is connected to Cb for integration, and then isolated and biased to begin another collection period.

It should be noted that this mode of operation is substantially different from the mode of operation used in the prior art of photodiode device. That is, the prior art applies a constant bias to a photodiode, and often includes much complicated circuitry to achieve the constant bias. In effect, the prior art senses changes in current caused by changes in flux, and the bias voltage is therefore carefully selected to achieve a locally maximum value of the derivative of current with respect to flux. By contrast, in this embodiment of the present invention the key criterion for sensitivity is the partial derivative of capacitance with respect to flux, across the band of voltages to which the photodiode is exposed during its integration time. That is, as flux generates photocarriers in the photodiode, the width of the depletion region will gradually narrow, and therefore the capacitance across the diode will increase and the voltage will decrease.

In this embodiment, the maximum flux collection time in the photodiode is limited not merely by the considerations of number of integrate cycles per read cycle and the desired timing of the read cycles, as discussed above with reference to the principle preferred embodiment, but is also limited by the self-debiasing behavior of the photodiode as discussed above.

The architecture of the respective silicon averaging capacitor sites 54 which underlie each MIS detector site so will now briefly be described. As shown in FIG. 3, the bond pad area 22 within the metallization layer 68 is defined by the absence of the protective nitride overcoat, which otherwise protects all of the silicon chip. Bond pad 22 is aligned with via 16 in the HgCdTe cell overhead, so that the metal interconnect 20 connects bond pad 22 to storage gate 14. The metal bond pad 22 is connected to a moat 36 at contact 42, and transistors 38 (M2) and 40 (M1) provide selective connection to the bond pad 22 in metal layer 68. When the clock line $\phi_i$ 28 is raised, the bond pad 22 is connected to the bottom plate 32 of the poly-to-poly capacitor 30. The poly-to-poly capacitor 30 has a capacitance which is typically at least comparable to storage gate 14, and thus, when transistor 38 is activated, the signal which has been generated between storage gate 14 and the HgCdTe substrate can be averaged with the signal which has been stored in capacitor 30, as will be discussed below.

The transistor 40 is controlled by another clock line 26 ($\phi_{mux}$), and this transistor 40 selectively connects the bond pad 22 (and therefore the storage gate 14) to a read line 24. Thus, to accumulate the wells and reset the storage gate for a new integration time, the read line 24 is used to apply these two signals to all cells. Similarly, when the recursively averaged signal stored in capacitor 30 is to be read out, both lines $\phi_i$ and $\phi_{mux}$ are raised, to connect bottom plate 32 to word line 24. The fabrication of the silicon is preferably done using a 3 micron double-poly MOS process, which is standard except in one point: the dielectric of capacitor 30 is preferably formed as an oxide/nitride/oxide composite. This particular composite dielectric provides a precisely controlled high specific capacitance together with a low defect density. Briefly, an oxide is formed over first poly (either grown or deposited), nitride is deposited, and the nitride is partially oxidized at the same time as the second gate oxide is grown. This process is described in greater detail in U.S. patent application Ser. No. 468,920 which is assigned to the assignee of the present application and which is hereby incorporated by reference.

The operation of this imager will now be described in somewhat greater detail, to provide more explanation of the noise reduction advantages gained.

Figure 12:
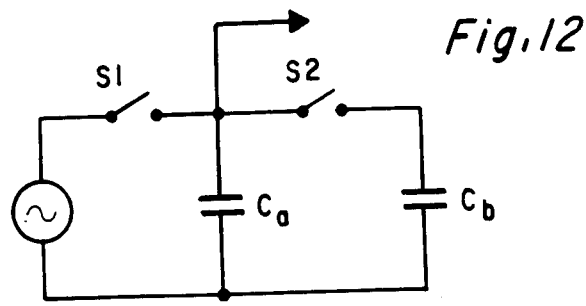
FIG. 12 is a schematic circuit diagram used in explaining the noise enhancement averaging operation used in the present invention.

FIG. 12 shows a hypothetical schematic which will be used to discuss the effect of recursive averaging. The switches S1 and S2 are opened alternately, with no overlap. The output voltage will be referred to as a time series $X_n$, and the input voltage will be referred to as a time series $Y_n$. When switch S2 is closed, the output voltage $X_n$ equals a weighted average of the previous output voltage with the current input voltage:

$$V_{out} = X_n = \alpha X_{n-1} + (1-\alpha) Y_n,$$

Where alpha is a factor which is defined as:

$$\alpha = \frac{C_b}{C_a + C_b}$$

In the low frequency limit, $X_n$ is equal to $Y_n$:

$$\frac{X_n}{Y_n} = \frac{1-\alpha}{1-\alpha} = 1$$

For variances associated with $Y_n$, i.e. for noise which is due to noise contained in the input signal, $$\frac{\bar{X}_n}{\bar{Y}_n} = \frac{1-\alpha}{1+\alpha}$$

The signal-to-noise ratio is then $$\frac{\bar{X}_n}{X_n} = \frac{1-\alpha}{1+\alpha} \times \frac{\bar{Y}_n}{Y_n}$$

Thus, recursive filtering enhances the signal-to-noise ratio by an amount which depends on the factor alpha, i.e. on the ratio of the input capacitor Ca to the averaging capacitor Cb.

Ca in this example corresponds generally to the MIS capacitor defined by the gate 14, and Cb corresponds generally to the averaging capacitor 30 which is located in the silicon. That is, the recursive averaging can substantially reduce the noise power which is due to detection of the background flux (shot noise).

Figure 9:
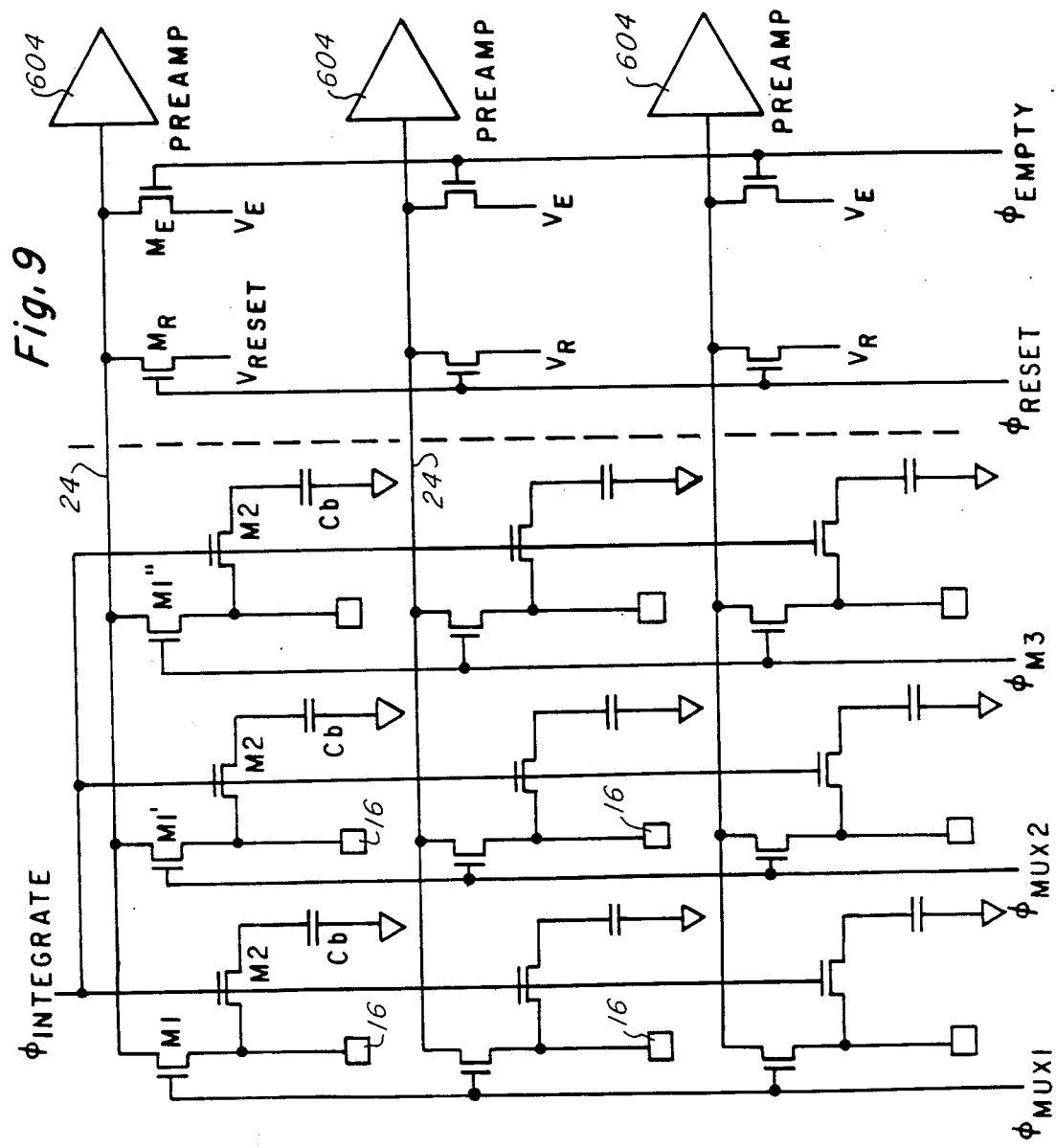
FIG. 9 is an equivalent circuit diagram of a portion of the silicon averaging array with its connections, as preferably used in practice of the present invention.
Figure 10:
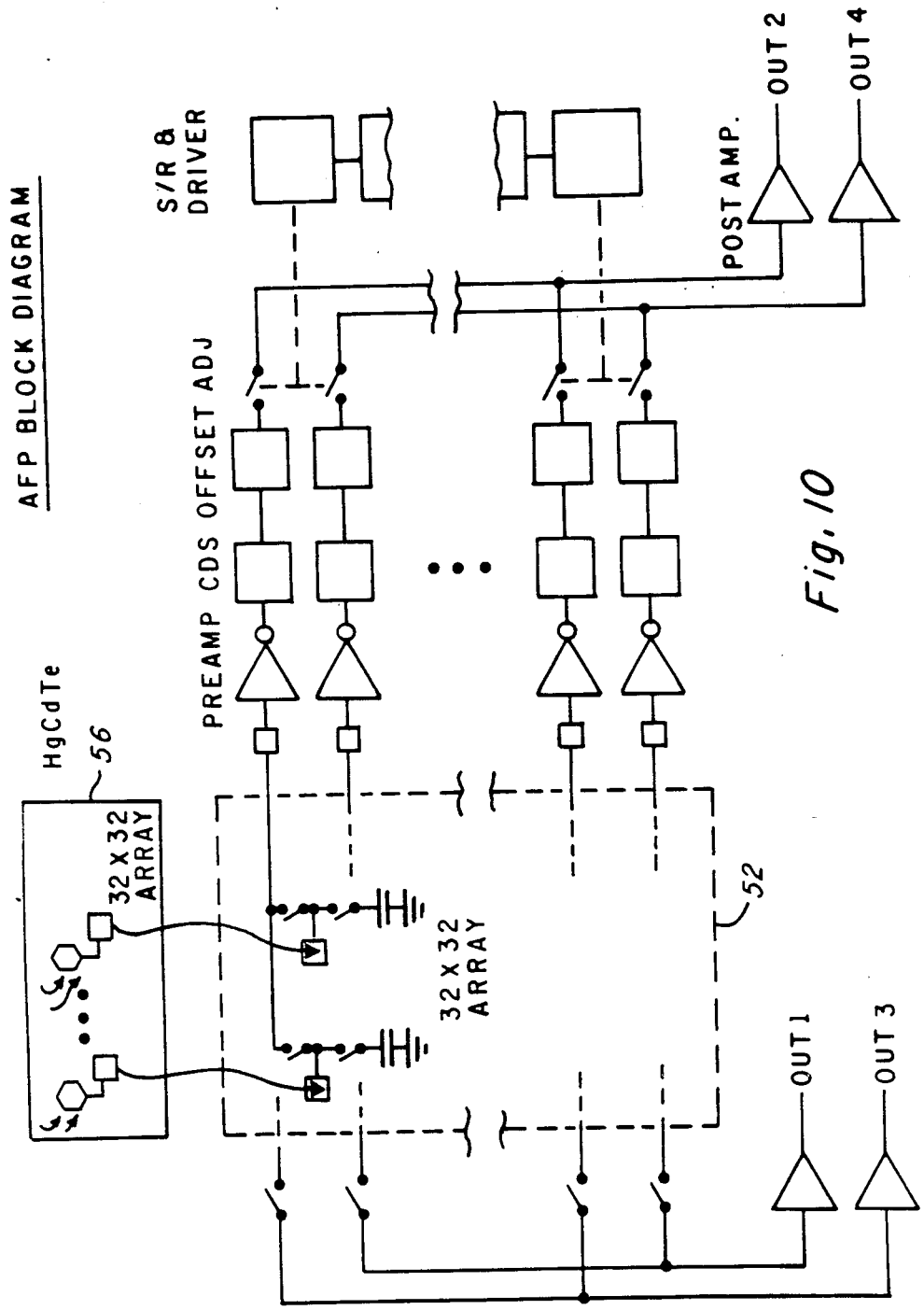
FIG. 10 shows schematically the relation of the HgCdTe detector array, the silicon averaging sites under the array, and the peripherals on the same chip, in an embodiment such as FIG. 6.

FIG. 9 shows the layout and timing of a first simplified embodiment of the present invention. Note that the bias 16 shown at every pixel location connect vertically to the HgCdTe MIS detector site which is not shown. This simplified embodiment depicts only a 3×3 array, but much larger array sizes are preferable, and array sizes of 128×128 and larger are expected to be the best mode of practicing the present invention in the future. In this simplified embodiment, the M1 switches are used both to reset the MIS array and to multiplex the signals during readout. The M2 switches perform the recursive integration onto the silicon averaging capacitors. (Note that the connection of M2 and M1 is opposite to that shown in the embodiment of FIG. 3.) In this embodiment, the $\phi_i$ ($\phi_{integrate}$) signals are operated in unison for all pixels in order to simplify clocking. Separate voltages are supplied for resetting the read line (Vr) and for emptying the MIS wells (Ve). A typical clocking sequence for such an array is as follows: (1) Ve is impressed onto all MIS capacitors via transistor ME and all transistors M1. This collapses all wells, and the storage charge is recombined. (2) Vr is impressed onto all MIS capacitors via transistor MR and all transistors M1. This allows optically generated charge to collect in all of the MIS wells. Next, all of the lines $\phi_{mux}$ which are also designated in various drawings as $\phi_{m2}$; $\phi_{m3}$, etc.) are turned off, and all wells continue to collect signal charge. This sequence of steps is repeated until it is desired to begin readout operations. That is each pixel site can go through a number of collect-and-integrate cycles at a very high duty cycle before a readout cycle for the array is begun. When readout begins, the row that is to be addressed is addressed through the appropriate transistor M1. This should be done after an integrate phase, to gain advantage of the noise reduction effects of recursive filtering as discussed above.

In an alternative embodiment, the well of a row being read can be collapsed. That is, if the wells are not collapsed before readout, the incident flux will be changing the voltage across the MIS capacitor, and therefore the output voltage, while the read operation is in progress. It is conceivably possible that, under some flux conditions, such a changing output signal might trigger an instability in some sense amplifier design. However, this mode of operation is believed not to be a necessary precaution in the preferred embodiment.

Figure 7:
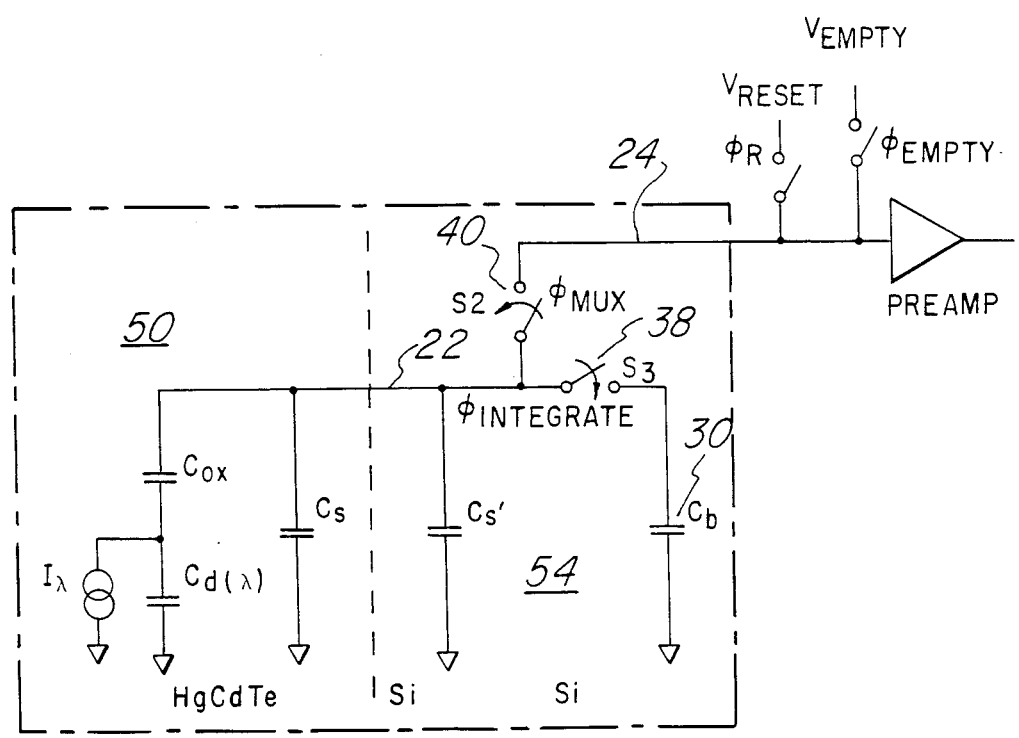
FIG. 7 is an equivalent circuit, showing a single pixel with its connections, used in explaining the detection and integration operation of the present invention.
Figure 8:
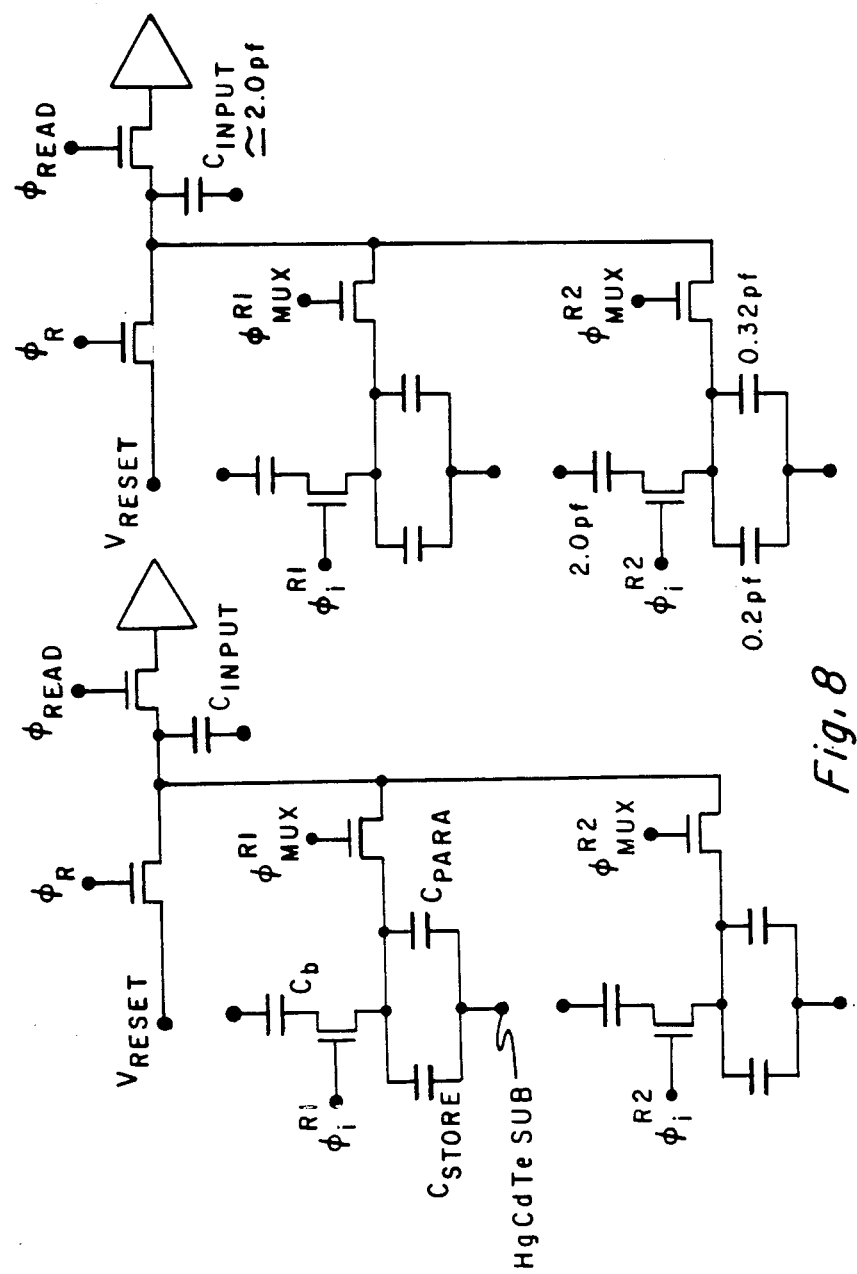
FIG. 8 show schematic diagrams of several pixels, and indicates some typical capacitance values.

FIG. 7 is an equivalent circuit for a pixel and its averaging capacitor 30 with connections including pad 22, transistors 38 and 40, and read line 24. The transistors are represented as switches S3 and S2, stray capacitances in the silicon and HgCdTe are representing by Cs' and Cs, and the charge accumulation by the MIS capacitor is represented as a current generator plus insulator and depletion capacitors.

After the preamplifiers 604, the preferred additional circuitry uses a correlated double sampler 602. This correlated double sampler is clamped just after the reset voltage has been applied, and is released before the row line $\phi_{mux}$ is activated. After the read output has been provided to the read line 24, the second sample is taken. The signal information is found by comparison of the empty well potential (which is equal to Vr) and the actual potential which is read out from a particular storage gate 14.

Figure 13:
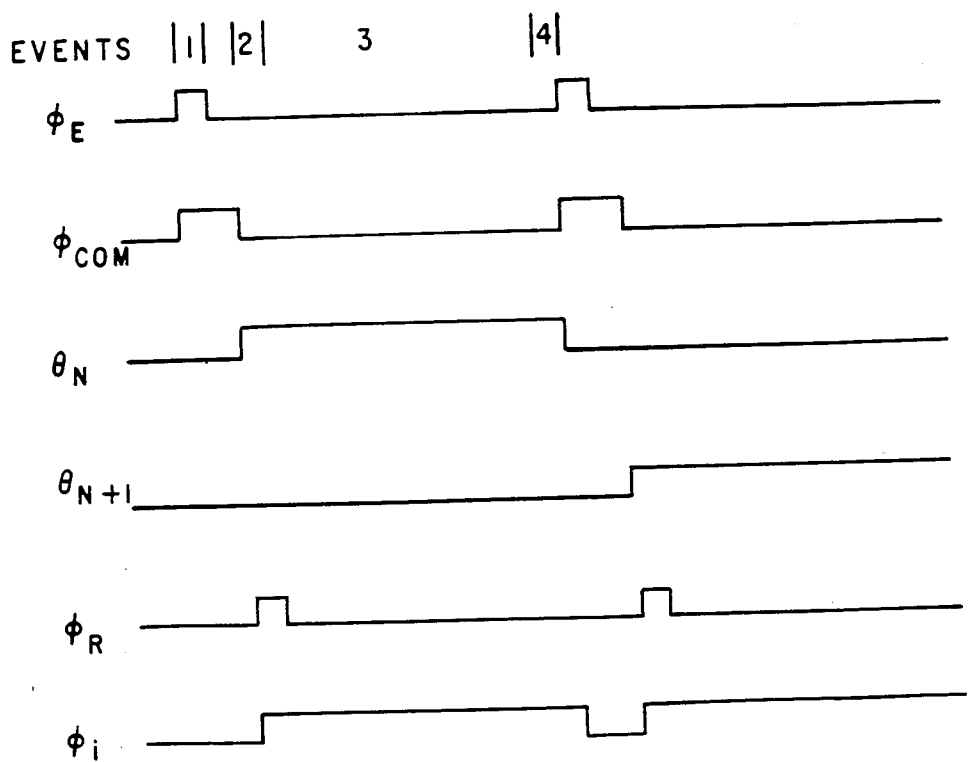
FIG. 13 is a timing diagram which shows a simplified mode of operation of the present invention.

The timing chart of FIG. 13 shows the timing of the read operation is slightly more detail. In this simplified electronically scanned mode of operation of the invention, the duty cycle and sensitivity are not optimal, but explanation of this embodiment will clarify the operation of the preferred recursive read mode of operation which will be described next. Note that the signal which appears on any one row line $\phi_n$ is the logical sum of a common row line signal $\phi_{com}$ with a component $\theta_n$ which is peculiar to that row line. At event number 1, which is the start of the nth cycle, all detector elements are first reset to Ve, which puts them in accumulation.

Next, the $\theta_n$ signal selects the nth row. All detectors are connected to their respective integration capacitors 30 by a $\phi_i$ signal. After the rise of both $\theta_n$ (and therefore $\phi_i$) and $\phi_i$, the nth detector's capacitor 14 and the nth integration capacitor 30 (Cb) are both reset to Vr. The reset voltage Vr is chosen so that the storage capacitor 14 will be depleted. During event 3, photogenerated carriers are collected in the nth row detector. At event 4, the collected charge in the nth row detector is sensed. The output signal is the difference between the detector voltage at the end of event 2, which is the empty-well potential Vr, and the detector voltage at event 4.

The recursive read operation, which is the presently preferred embodiment, will now be described in more detail, with reference to an embodiment in which the averaging capacitor 30 has a capacitance which is at least twice that of the MIS capacitor. This translates to a value of $\frac{2}{3}$ for the parameter alpha, and a maximum signal-to-noise improvement of the square root of 5. For best use of recursive filtering, the number of rows which needs to be integrated during each active integrating time is at east one plus alpha over one minus alpha, or in this case five rows. After a row has been read, it can be left idle until it can usefully begin collect-and-integrate cycles preparatory to the next read phase. That is, in this embodiment the row which has just been read remains in standby (accumulation) until five integration periods before that row is next to be read. It would be possible to put a row through more collect-and-integrate cycles before each read than strictly necessary, or even to keep all rows not being read in collect-and-integrate cycles, but this not preferred, due to the substantial additional load on the peripheral circuits.

Figure 14:
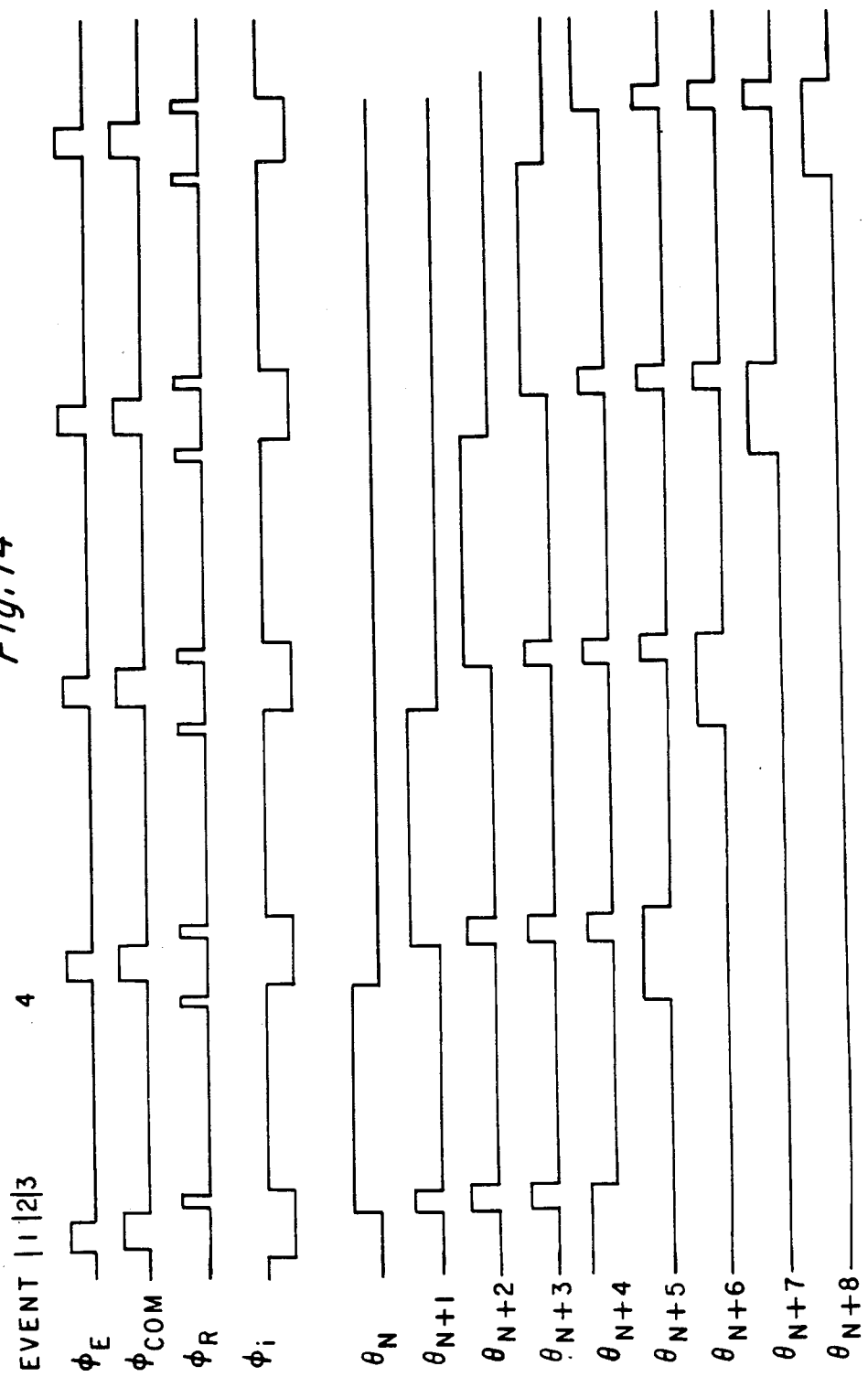
FIG. 14 is a further timing diagram which shows the presently preferred operation of the present invention.

The varied steps in the recursive read process will now be described with reference to the timing chart in FIG. 14. At event 1, all detectors are reset in accumulation, to empty all wells. This is done while the detectors are isolated from their respective integration capacitors 30, via open, $\phi_i$ switches. At event 2, all detectors other than rows N through N+4 are disconnected from the read line. Detectors N through N+4 are reset to Vr, via signals $\phi_r$ and $\theta_n$ through $\theta_{n+4}$. (Again each row line signal $\phi_n$ is defined as $\phi_{com}+\theta_n$.) Thus the photocapacitors in rows N through N+4 are biased in depletion, where they are free to collect optically generated charge. At event 3, detector N remains addressed through signal $\theta_N$, while rows N+1 through N+4 are isolated from the read line. After N+1 through N+4 have been isolated from the read line, signal $\phi_i$ connects all capacitors 30 to their respective detectors 14. Those that are connected to active detectors again recursively integrate the latest photo generated signal with the store averaged signal. The cells in which this $\phi_i$ clock connects storage capacitors to inactive detectors (i.e. to detectors in accumulation), eventually seek Ve.

At event 4, charge continues to collect and integrate until the MIS detector is reset to Vr by the clock phase $\phi_r$. Note that, in two rows, the integration capacitors 30 are reset to the reset voltage Vr. The capacitor in row N+5 is reset to Vr to initalize it for recursive integration of further signals. The integration capacitor in row N is also reset to Vr at this point, but that is unimportant and optional.

The output signal is again defined by the difference between full and empty well potentials. A five frame recursive average of the nth row is found on the read line just prior to the $\phi_r$ clock at event 4. Several more cycles of timing are illustrated to show the standby integrate and readout progression throughout the array.

Figure 19:
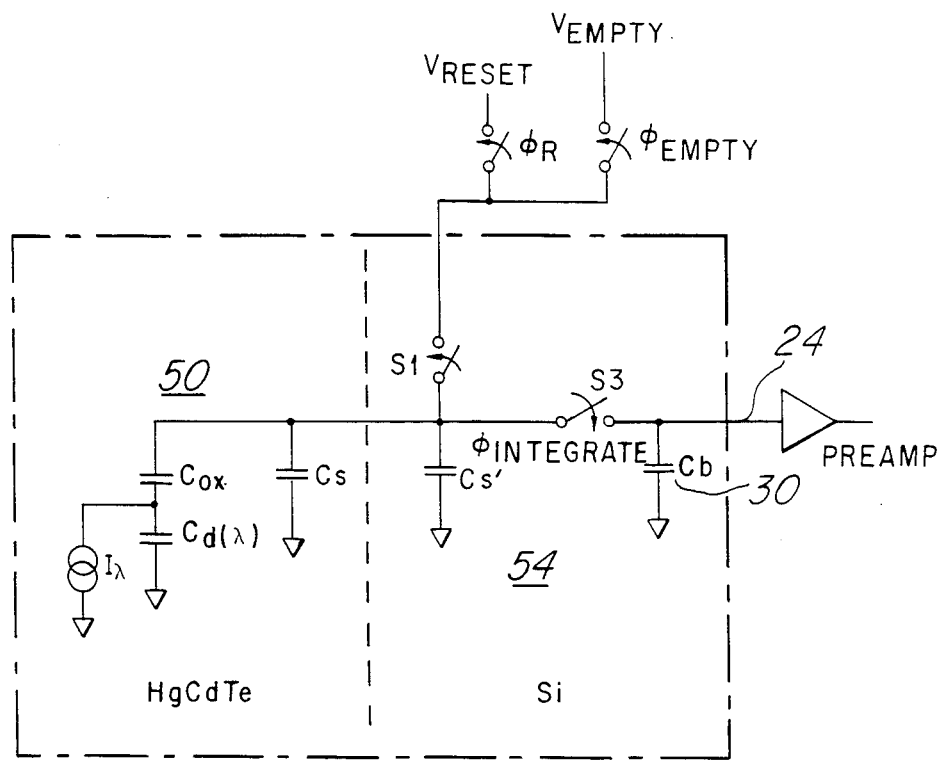
FIGS. 19, 20 and 21 show alternative embodiments' equivalent circuits for a pixel and its connections.
Figure 20:
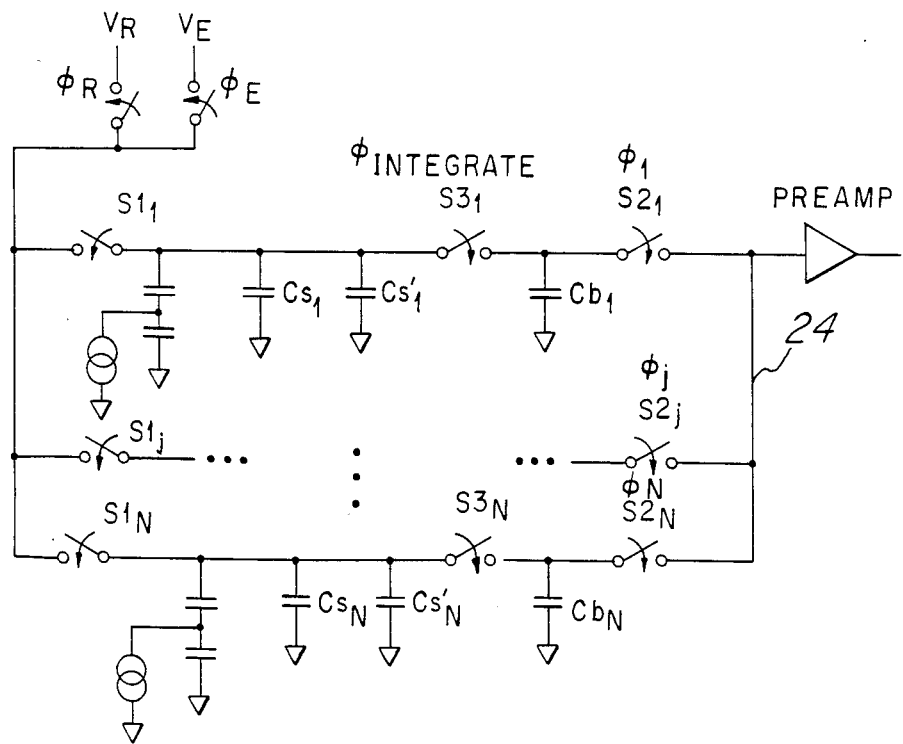
Figure 21:
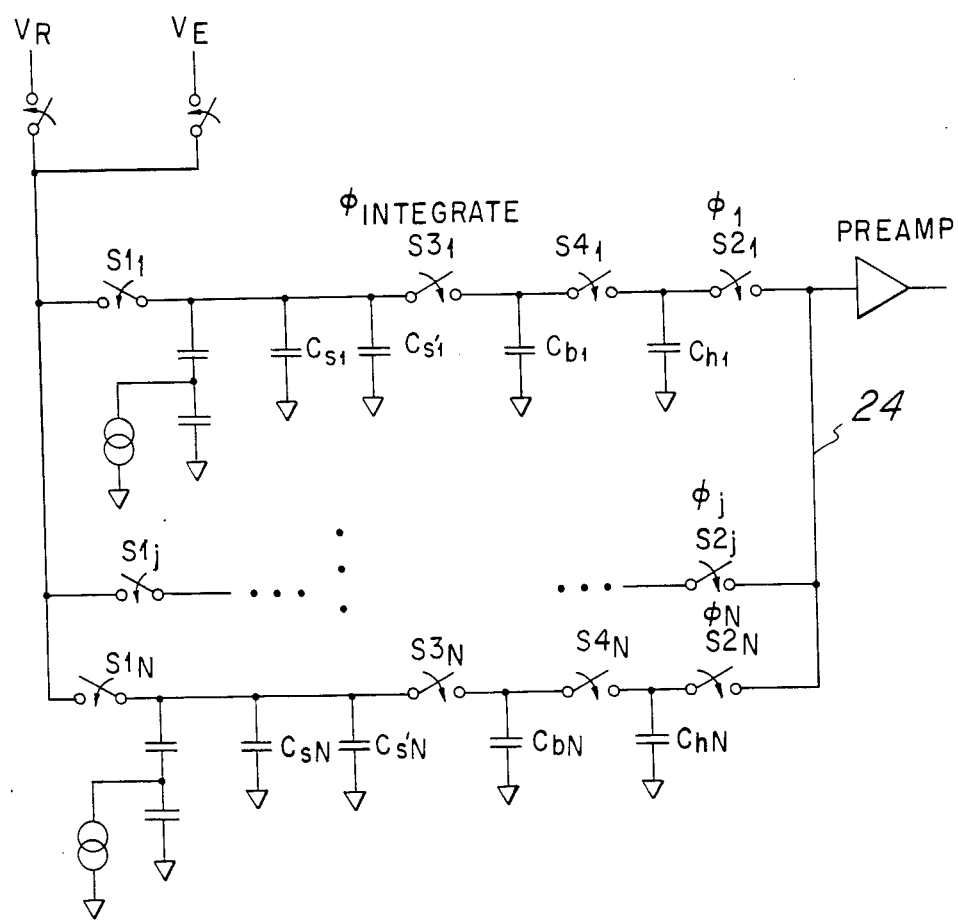

Alternative embodiments of the pixel and its averaging capacitor are shown in FIGS. 19–21. In particular, FIG. 19 shows an embodiment with the read line 24 directly connected to the averaging capacitor 30 and separate from the reset and empty voltages. The embodiment of FIG. 19 recursively integrates by toggling S3 in the same manner as the embodiment of FIG. 7. For single read mode of operation (no recursive averaging), switch S3 is always closed and may be replaced by a simple interconnect.

FIG. 20 shows an embodiment that allows multiple pixels (with each pixel similar to the pixel of FIG. 19) to be multiplexed into a single amplifier. Thus an imager array with rows and columns of pixels could have each column of pixels as in FIG. 20; note that each such column of pixels would be the analog of one row of pixels of FIG. 9. An array would have multiplex and integrate lines for controlling switches $S2_1, \ldots, S2_n$ and $S3_1, \ldots, S3_N$, plus further multiplex lines for controlling switches $S1_1, \ldots, S1_N$ for the well emptying and resetting.

FIG. 21 shows an embodiment similar to that of FIG. 20 and that allows information on each $Cb_1, \ldots, Cb_N$ to be sampled onto a corresponding holding capacitor $Ch_1, \ldots, Ch_N$. The addition of holding capacitors $Ch_1, \ldots, Ch_N$ allows the pixel operation to continue while the information on $Ch_1, \ldots, Ch_N$ is read using an optimum low bandwidth amplifier. Additional switches may be added to the above embodiments for setting initial conditions on the capacitors although doing such does not yield a unique pixel configuration. Initial conditions are desirable for scanning arrays as the reset of capacitor initial conditions assures there is no video crosstalk as a system scans from one instantaneous field of view to another.

Figure 11:
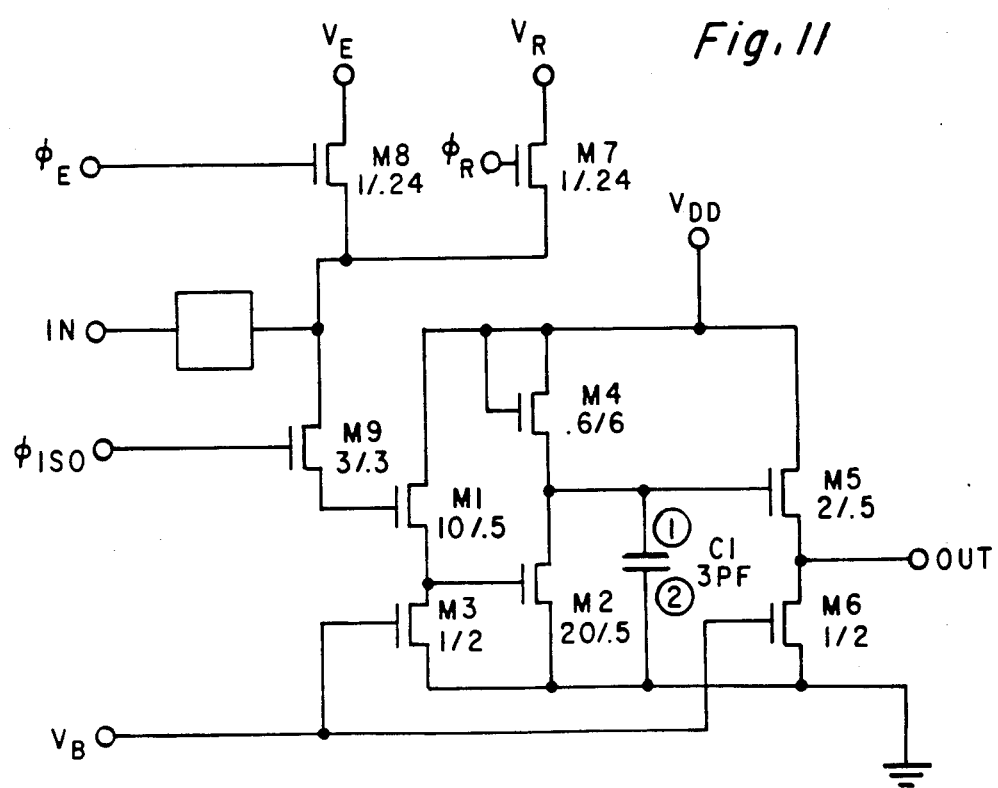
FIG. 11 shows an output circuit implementation of the imager of FIG. 6.

FIG. 11 shows a sample preamplifier circuit, used to amplify the signal from one detector pixel. M9 is used to isolate preamp from detector array during Det. probe. M1 and M2 are source followers. M2 and M4 are enhancement inverting gain stages. Capacitor C bandlimits system. M5 and M6 are output buffer source followers. Vb biases M3 and M6 as current sources.

It should be noted that the present invention can tolerate low quality HgCdTe device material, since it is less sensitive to the noise figure degradation of dark currents than most prior art devices are. For example, the present invention can be embodied using HgCdTe having intrinsic carrier concentrations of $5 \times 10^{14}$ or higher, although this is not preferred.

That is, as is well known in the art, there are a number of parameters which can be traded off in optimizing an infrared imager for a particular application. These include sensitivity, duty cycle, data rate, and array size. An example of the calculated performance of an MIS imaging array according to the present invention will now be discussed, to indicate the resulting performance. Suppose that the HgCdTe device quality is such that a 1500 angstroms zinc sulphide MIS gate can sustain a voltage differential of (V−Vth) of 1 volt, and a 3000 angstrom layer of zinc sulphide can withstand 2 volts. Assume dark current to be 300 microamps per square centimeter for the storage area. This generally corresponds to HgCdTe having a intrinsic carrier concentration in the neighborhood of $5 \times 10^{14}$. Assume that the 8-10 micron spectral band is received. Assume that the processor input preferred noise specification is set at 10 microvolts, and that the load capacitance added by the silicon input circuit is 2 picofarads. Assume that the net transmission through the optics is 0.7, and that the maximum flux in the focal plane (assuming a 350° K. farfield seen through f/3.2 optics having 8" focal length) is $1.6 \times 10^6$ beam photons per centimeter squared per second. It should also be noted that the dielectric constant of zinc sulphide is 8.8 at 77° K. From these data. the performance is calculated as follows: the load capacitance is 2.3 picofarads at the pixel. Thus, the pixel integration time must be 12 microseconds. The fullwell charge capacity is $3.3 \times 10^6$ carriers. The duty cycle is 9.2%, assuming currently used frame rates typical of a 64×64 infrared area imager. The sensitivity is then 538 microvolts per degree centigrade at the pixel site, and 237 microvolts per degree C. at the output node. The noise at the read node is uncalculated as 14 microvolts, and the noise equivalent temperature figure for 1 frame is 0.059° C. The system equivalent noise temperature at a 60 Hz framerate is then 0.017° C. This provides a substantially improved system noise equivalent temperature, which permits various other parameters to be separately pushed as follows: the maximum data rate on one silicon column is equal to the length of the array, divided by the number of recursive integration times plus 1, divided by the integration time. If 9 recursive integrations are used, and the integration time is 12 microseconds, and each column contains 64 pixels, then the maximum data rate is seen to be 530 kHz.

Maximum system sensitivity can be acquired by summing frames for a relatively long period of time, e.g. 16 msecs. That is, one frame can be read in (N+1)(ti+ta), where N is the number of recursive integration cycles, and ti and ta are the integration and addressing required times respectively. For example, where 9 recursive integrations are applied, and where 12 microsecond integration is possible, and if 4 microseconds are required for addressing, then one frame can be read in 160 microseconds. Therefore, in 16 msecs 100 frames can be read, and the system equivalent noise temperature is further improved by a factor of the square root of 100. This results in an estimated system equivalent noise temperature of 0.0059° C.

Thus the present invention advantageously provides the advantages that; an infrared area imager which will provide a detailed image at wavelengths down to the limits of the available atmospheric window, i.e. at wavelengths as long as about 12 microns.

Thus the present invention advantageously provides an infrared focal plane array imager architecture which permits direct connection from an infrared detection site to silicon processing stages, and also an infrared focal plane array imager architecture which permits very high duty cycles at the infrared sensor sites.

Thus the present invention advantageously provides a long-wavelength infrared imager which does not require inherent carrier concentrations below $5 \times 10^{14}$ per cubic centimeter.

Thus the present invention advantageously provides a long-wavelength detector which provides a very good signal-to-noise, even in the face of substantial long-wavelength background flux.

As will be appreciated by those skilled in the art, the present invention provides a major novelty in the art of infrared imagers. In view of the very broad novelty set forth in the present patent application, the present invention can be embodied in a wide variety of modifications and variations, and the present invention is not limited except as may be defined in the claims. All claims should be interpreted broadly, in accordance with the pioneering status of the present invention.

What is claimed is:

1. An infrared imager array, comprising,
(a) a plurality of pixels arranged into rows and columns;
(b) a plurality of row conductors, one row conductor for each row of pixels;
(c) a plurality of column conductors, one column conductor for each column of pixels;
(d) at least one third conductor;
(e) each of said pixels separately including:
  i. a capacitive photodetector;
  ii. a first switch connected between a first plate of an averaging capacitor and said column conductor for the column of the pixel and with the control of said first switch connected to said row conductor of the row of the pixel; and
  iii. a second switch connected between said first plate and a plate of said capacitive photodetector, the control of said second switch connected to said at least one third conductor; and
(f) a voltage sensor for each of said column conductors.

2. The array of claim 1, wherein:
(a) said capacitive photodetector includes a conductive gate on an insulator on a semiconductor member with the semiconductor of bandgap less than the energy of the infrared photons to be detected and with said semiconductor, member exposed to the infrared photons to be detected, said conductive gate forming said plate of said capacitive photodetector;
(b) said voltage sensors are located in a silicon substrate; and
(c) said semiconductor members are affixed to said silicon substrate.

3. The array of claim 2, wherein:
(a) said semiconductor is chosen from the group consisting of HgCdTe, HgCdZnTe, HgZnTe, PbSnTe, InSb, and InBiSb.

4. The array of claim 1, wherein:
(a) said capacitive photodetector is a p-n junction in a semiconductor member with the semiconductor of bandgap less than the energy of the infrared photons to be detected and with said semiconductor member exposed to the infrared photons to be detected;
(b) said voltage sensors are located in a silicon substrate; and
(c) said semiconductor members are affixed to said silicon substrate.

5. The array of claim 1, further comprising:
(a) a second plurality of second column conductors, one second column conductor for each of said columns;
(b) a plurality of third switches, each of said pixels including one of said third switches between said plate of said capacitive photodetector and said second column conductor for said pixel; and
(c) a reference voltage supply for said second column conductors.

6. The array of claim 5, further comprising:
(a) a holding capacitor for each of said pixels, said holding capacitor with one plate connected between said first switch and said first plate; and
(b) a fourth switch for each of said pixels, said fourth switch connected between said one plate and said first plate.

* * * * *